United States Patent
Sakai et al.

(10) Patent No.: US 6,847,409 B2
(45) Date of Patent: Jan. 25, 2005

(54) VIDEO SWITCHING DETECTING CIRCUIT (75) Inventors: Takehiko Sakai, Yokohama (JP);
Daijiro Kawai, Yokohama (JP);
Kazuhide Nakamura, Kawasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 507 days.

(21) Appl. No.: 10/048,506

(22) PCT Filed: May 30, 2001

(86) PCT No.: PCT/JP01/04565
§ 371 (c)(1),
(2), (4) Date: Mar. 25, 2002

(87) PCT Pub. No.: WO01/93589
PCT Pub. Date: Dec. 6, 2001

(65) Prior Publication Data
US 2002/0113892 A1 Aug. 22, 2002

(51) Int. Cl.[7] .............................................. H04N 5/268
(52) U.S. Cl. ........................ 348/705; 348/540; 348/547
(58) Field of Search .................................. 348/705, 706,
348/524, 521, 536, 540, 547, 542; 375/328,
344, 362; H04N 5/268, 5/06, 5/05

(56) References Cited

U.S. PATENT DOCUMENTS 5,790,200 A * 8/1998 Tsujimoto et al. .......... 348/536
6,222,590 B1 * 4/2001 Makino ....................... 348/547
6,583,822 B1 * 6/2003 Jun ............................. 348/537

FOREIGN PATENT DOCUMENTS

| JP | 10-55161  | 2/1998  |
| JP | 10-155145 | 6/1998  |
| JP | 10-301526 | 11/1998 |

* cited by examiner

Primary Examiner—Sherrie Hsia
(74) Attorney, Agent, or Firm—Pearne & Gordon LLP

(57) ABSTRACT

The object of the invention is to provide a video switchover detection circuit that reduces the circuit scale and allows high-accuracy detection with a smaller-scale configuration.

According to the invention, the video switchover detection circuit comprises a PLL circuit composed of a phase comparator, an LPF, a VCO, and a frequency divider. In the phase comparator, the phase of an external HD as an input signal obtained by shaping the pulse of a horizontal synchronization signal is compared with the phase of an internal HD as a reference signal obtained by dividing the frequency of the output pulse of the VCO in the PLL circuit. In case the phases of the signals differ from each other, an error signal is output from the phase comparator. A first counter counts the period in which the error signal is active, or the time when the phase difference persists. A horizontal synchronization decision section determines the lock state of the horizontal synchronization signal depending on the length of the phase difference duration and in case out of synchronization is detected, a video switchover detection signal is output from an output circuit.

4 Claims, 5 Drawing Sheets

FIG. 1

FIG. 3A  LOCK STATE

FIG. 3B  UNLOCK STATE

VIDEO SWITCHING DETECTING CIRCUIT

TECHNICAL FIELD

The present invention relates to apparatus for inputting a video signal for example from a video camera and performing signal processing and recording, and in particular to a video switchover detection circuit that uses a phase-locked loop circuit.

BACKGROUND OF THE INVENTION

Conventionally, a method for detection of video switchover by detecting out of lock of a phase-locked loop circuit (hereinafter referred to as a PLL circuit) by using a PLL circuit, as a method for detecting switchover of video signals. Such methods for detecting out of lock of a PLL circuit includes a method for monitoring a voltage (hereinafter referred to as a VCO control voltage) to be applied to control a voltage-controlled oscillator (hereinafter referred to as a VCO) The VCO control voltage is typically an output of a low-pass filter. The low-pass filter includes a capacitor so that re-charging/discharging of the low-pass filter takes time and not fit for apparatus that requires high-speed operation. In order to offset this disadvantage, methods have been proposed for detecting the dislocation amount of a synchronization signal for an input signal against a reference signal and detecting out of lock based on the dislocation amount of the phase, as described in the Japanese Patent Laid-Open No. 55161/1998 and the Japanese Patent Laid-Open No. 301526/1998.

Figure 5:
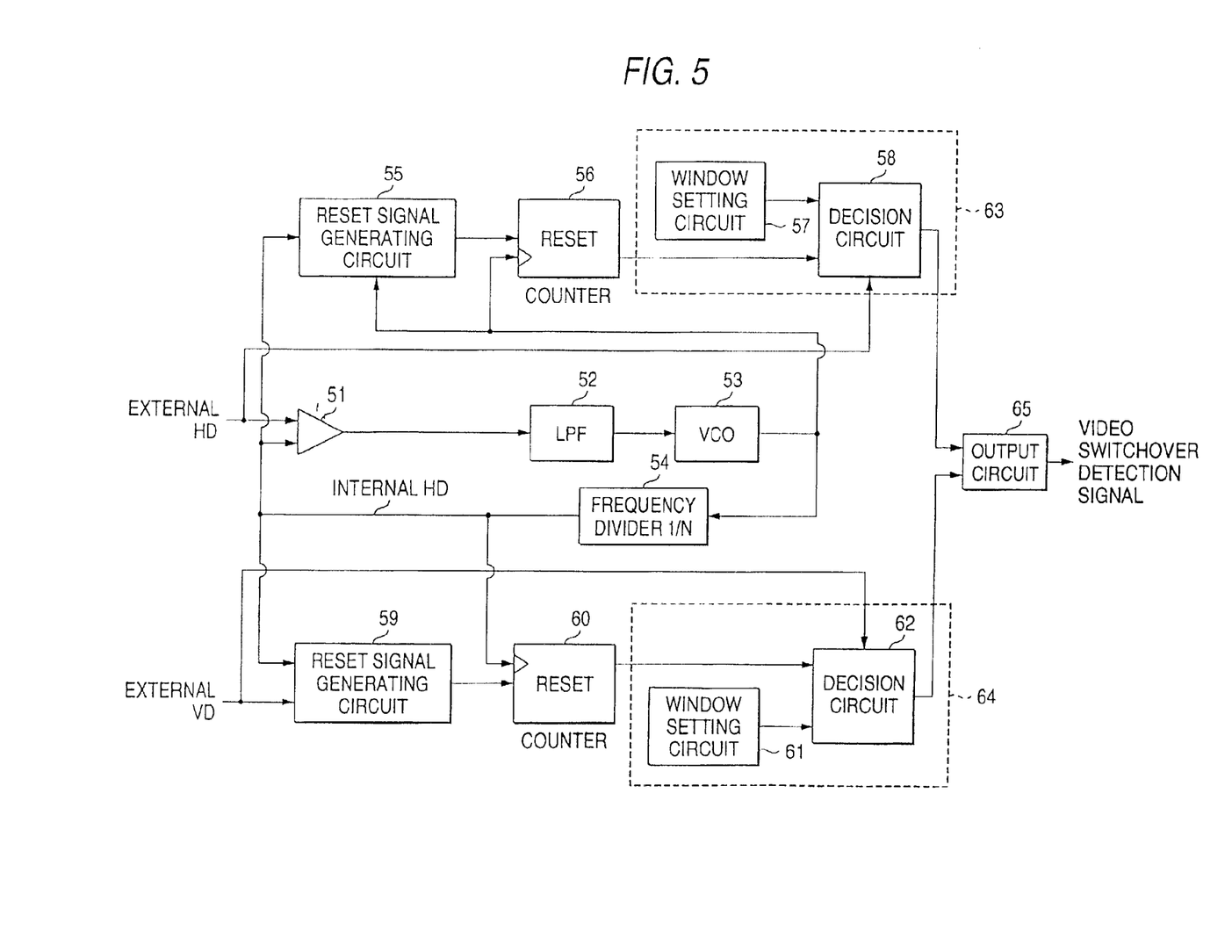
FIG. 5 is a block diagram showing the exemplary configuration of a related art video switchover detection circuit.

FIG. 5 is a block diagram showing an configuration example of a related art video switchover detection circuit. The video switchover detection circuit comprises a phase comparator 51, a low-pass filter (hereinafter referred to as an LPF) 52, a voltage-controlled oscillator (hereinafter referred to as a VCO) 53, and a frequency divider 54, and constitutes a PLL circuit with these circuits 51 through 54. As input signals, an external HD that is a pulse obtained by extracting and shaping a horizontal synchronization signal for a video signal and an external VD obtained by extracting and shaping a vertical synchronization signal are input. In the description that follows, a circuit that detects out of lock in the horizontal synchronization signal is called an H system and a circuit that detects out of lock in the vertical synchronization signal is called a V system.

For each of the H and V systems, there are provided reset signal generating circuit 55, 59, counters 56, 60, window setting circuits, 57, 61 and decision circuits 58, 62, respectively. The window setting circuit 57 and the decision circuit 58 compose an H system synchronization decision section 63. The window setting circuit 61 and the decision circuit 62 compose an V system synchronization decision section 64. Further, there is provided an output circuit 65 composed of an OR circuit that outputs as a video switchover detection signal the output of the synchronization decision sections 63, 64.

In the PLL circuit, the output of a phase comparator 51 is input to the VCO 53 via the LPF 52 to cause the VCO 53 to oscillate. The oscillation signal obtained is multiplied by 1/N by using the frequency divider 54 to generate an internal HD serving as a reference signal.

To detect out of lock in the horizontal synchronization signal, the output pulses of the VCO 53 are counted as a clock by the counter 56, and the lock state of the horizontal synchronization signal is determined by the synchronization decision section 63 based on the counter value of the counter 56. In this practice, the internal HD and the output of the VCO 53 are input to the reset signal generating circuit 55. A reset signal is generated based on the corresponding signal timings and input to the reset terminal of the counter 56. As a result, the counter 56 is reset based on the timing of the internal HD. The output pulses of the VCO 53 are counted by the counter 56 and the counter value is input to the synchronization decision section 63.

In the synchronization decision section 63, the window setting circuit 61 sets the window period for determining the lock state and the decision circuit 58 references the count value at the leading edge of the external HD and determined whether the timing at the leading edge of the external HD is within a predetermined widow period in relation to the internal HD. The synchronization decision section 63 detects the dislocation amount of the external HD against the internal HD. In case the dislocation amount has exceeded a predetermined value, the horizontal synchronization signal is assumed as out of synchronization and an out-of-lock detection signal is output.

To detect out of lock in the vertical synchronization signal, the lock state is determined same as the horizontal synchronization signal. That is, output pulses of the frequency divider 54 are counted as a clock by the counter 60, and the lock state of the vertical synchronization signal is determined by the synchronization decision section 64 based on the counter value of the counter 60. In this practice, the internal HD and the external HD are input to the reset signal generating circuit 59. A reset signal is generated based on the corresponding signal timings and input to the reset terminal of the counter 60. As a result, the counter 60 is reset based on the timings of the internal HD and the external HD. The internal HD is the counted by the counter 60 and the counter value is input to the synchronization decision section 64. Output pulses of the VCO 53 may be counted in parallel by the counter 60.

In the synchronization decision section 64, the window setting circuit 61 sets the window period for determining the lock state and the decision circuit 62 references the count value at the leading edge of the external VD and determined whether the timing at the leading edge of the external VD is within a predetermined widow period in relation to the internal HD. In case the synchronization decision section 64 has detected that the timing of the external VD against the internal HD exceeded a predetermined range, the synchronization decision section 64 assumes that the vertical synchronization signal is out of synchronization and outputs an out-of-lock detection signal.

In case the H-system or V-system out-of-lock detection signal is output, it is determined that the video signal input is switched over and the horizontal or-vertical synchronization signal has gone out of synchronization. At this time, a video switchover detection signal is output from the output circuit 65. In this way, detection of video switchover is performed based on the lock state of the horizontal or vertical synchronization signal.

In the aforementioned related art video switchover detection circuit, in order to detect the phase dislocation amount of a synchronization signal against the internal HD as a reference signal, a window is set to determine whether the timing at the leading or trailing edge of an input signal is within the window period. Thus, a window setting circuit or a counter with a large-scale circuit is required to count the clock over the window period. This resulted in a complicated and large-scale circuit configuration. For example, in detecting H-system out of lock, a counter for counting the window period needs some 10 bits because the timing of the external HD may be earlier than that of the internal HD. A large number of count value is required in order to determine out of lock thus taking time to determine out of lock.

The invention has been proposed in consideration of the aforementioned circumstances and aims at providing a video switchover detection circuit that reduces the circuit scale and allows high-accuracy detection with a smaller-scale configuration.

DISCLOSURE OF THE INVENTION

The first aspect of the invention is a video switchover detection circuit comprising a phase-locked loop circuit for comparing the phase of an input signal with that of an oscillating signal that is based on the input signal to perform phase synchronization, said video switchover detection circuit detecting switchover of input video signals by using a synchronization signal for a video signal used as said input signal and a reference signal that is based on said oscillating signal, characterized in that said video switchover detection circuit comprises phase comparison means for comparing the phase of a horizontal synchronization signal for said video signal with that of said reference signal, phase difference count means for starting to count time when a phase difference has occurred between both signals based on said phase comparison results and counting the period in which the phase difference persists, horizontal synchronization decision means for determining out of synchronization of said video signal in the horizontal direction in case the count value has exceeded a predetermined decision value based on the count value of said phase difference count means, and detection output means for outputting a video switchover detection signal indicating switchover of video signals based on the output of said horizontal synchronization decision means.

The second aspect of the invention is a video switchover detection circuit according to the invention characterized in that said phase comparison means outputs an error signal that goes active and indicates phase dislocation when the phase of a horizontal synchronization signal for said video signal differs from that of said reference signal and that said phase difference count means counts the clock of said oscillating signal in the period in which the error signal is active thus counting the period in which phase difference persists when said error signal is input to the enable terminal.

The third aspect of the invention is a video switchover detection circuit according to the invention comprising horizontal synchronization count means for counting the reference signal corresponding to the horizontal synchronization signal for said video signal and vertical synchronization decision means for determining out of synchronization of said video signal in the vertical direction based on the count value of said horizontal synchronization count means in case the count value obtained when the vertical synchronization signal for said video signal is input is below a specified decision value, characterized in that said detection output means outputs a video switchover detection signal indicating switchover of video signals based on the output of said horizontal synchronization decision means and said vertical synchronization decision means.

The fourth aspect of the invention is a video switchover detection circuit according to the invention comprising a phase-locked loop circuit for comparing the phase of an input signal with that of an oscillating signal that is based on the input signal to perform phase synchronization, said video switchover detection circuit detecting switchover of input video signals by using a synchronization signal for a video signal used as said input signal and a reference signal that is based on said oscillating signal, characterized in that said video switchover detection circuit comprises horizontal synchronization count means for counting the horizontal synchronization signal for said video signal, vertical synchronization decision means for determining out of synchronization of said video signal in the vertical direction based on the count value of said horizontal synchronization count means in case the count value obtained when the vertical synchronization signal for said video signal is input is below a specified decision value, and detection output means for outputting a video switchover detection signal indicating switchover of video signals based on the output of said vertical synchronization decision means.

In the aforementioned configuration, in the horizontal direction of the video signal, the phase of a horizontal synchronization signal is compared with that of a reference signal that is based on the oscillating signal of a phase-locked loop circuit. In case the phase of the horizontal synchronization signal differs from that of the reference signal, the duration the phase difference persisted is counted by the phase difference count means. In the vertical direction of the video signal, the reference signal corresponding to said horizontal synchronization signal, or the number of horizontal scanning lines in the video signal is counted frame by frame by the horizontal synchronization count means. Then it is determined whether the count value obtained when said synchronization signal is input is below a predetermined value, or whether the signal has changed over in the middle of a frame thus detecting video switchover.

This allows detection of video switchover by determining out of synchronization by using a small count value, thereby reducing the circuit scale of the count means. It is possible to simplify and downsize the configuration of the synchronization decision means thus providing accurate and easy video switchover. This also reduces the time required for counting for out-of-synchronization detection thereby reducing the time required to detect video switchover.

In the figures, a numeral 1 represents a phase comparator, 2 a low-pass filter (LPF), 3 a voltage-controlled oscillator (VCO), 4 a frequency divider, 5, 10 reset signal generating circuits, 6 a first counter, 7, 12 decision value setting circuits, 8, 13 decision circuits, 9 horizontal synchronization decision section, 11 a second counter, 14 a vertical synchronization decision section, and 15 an output circuit.

BEST MODE FOR CARRYING OUT THE INVENTION

The embodiment of the invention will be described referring to the drawings.

Figure 1:
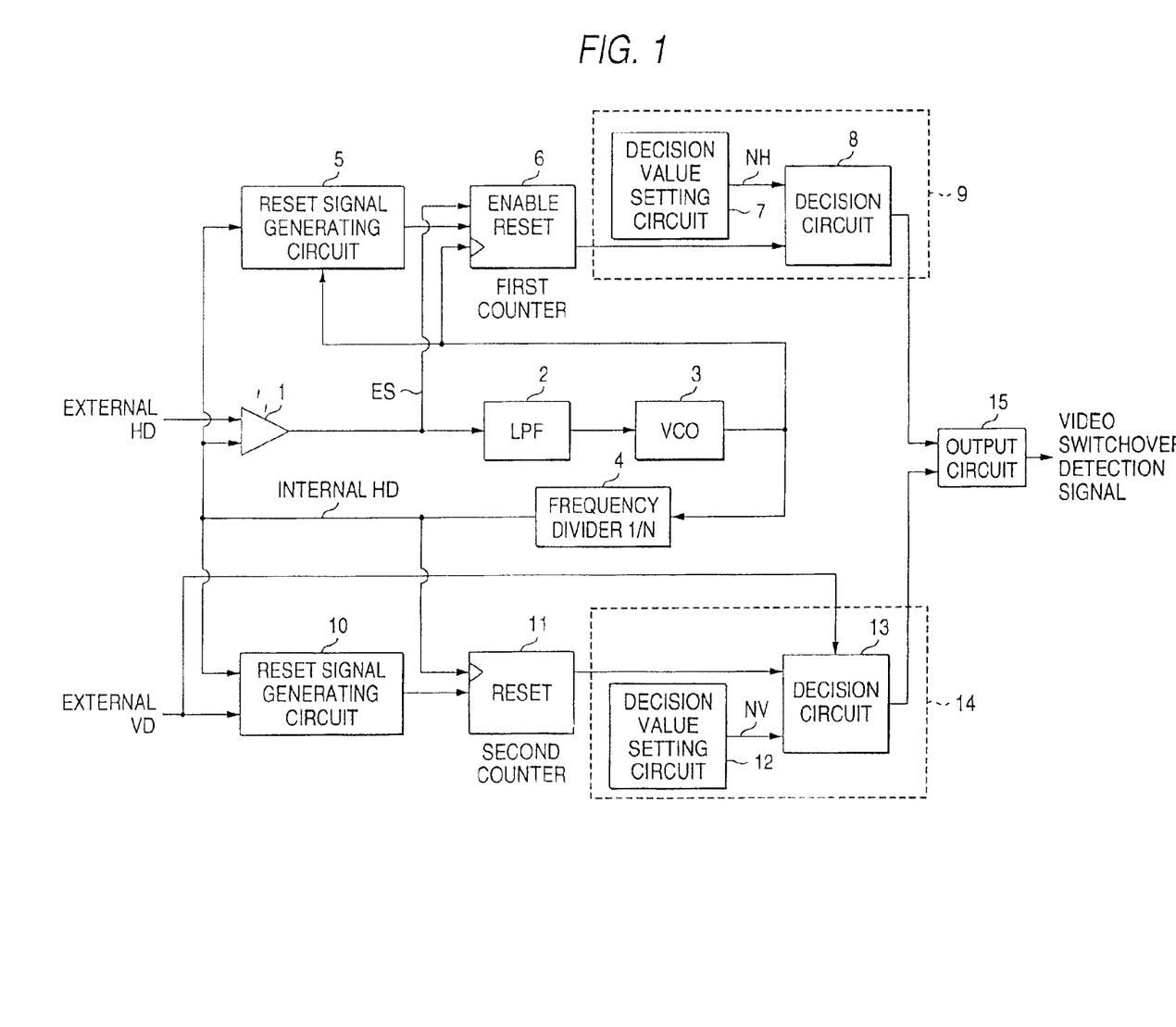
FIG. 1 is a block diagram showing the configuration of a video switchover detection circuit according to an embodiment of the invention.
Figure 2A:
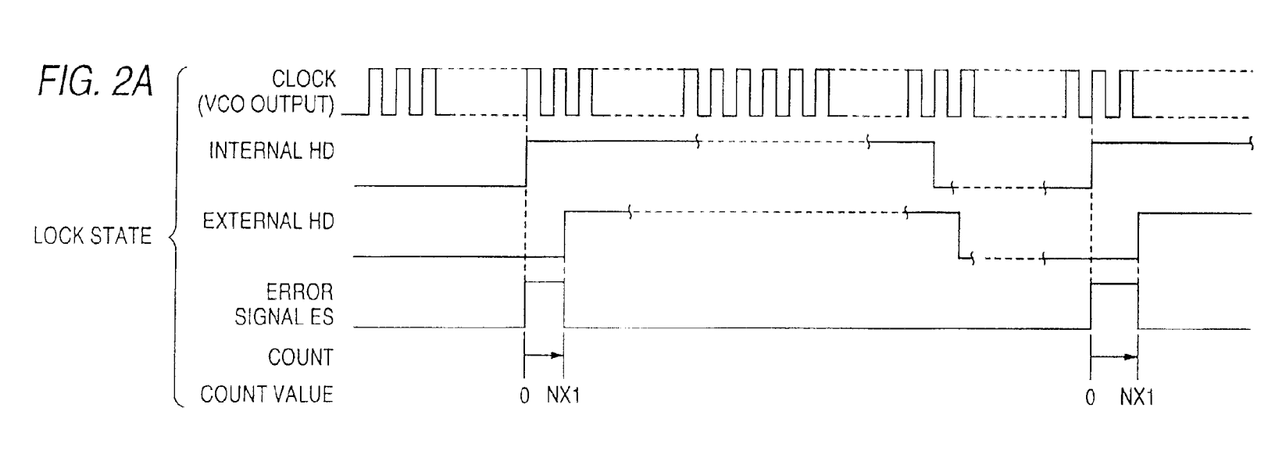
FIG. 2 is a timing chart showing the out-of-lock detection operation in the H system in the embodiment.

FIG. 1 is a block diagram showing the configuration of a video switchover detection circuit according to the embodiment of the invention. FIGS. 2 and 3 are timing charts showing the operation in the embodiment.

The video switchover detection circuit comprises a phase-locked loop circuit (hereinafter referred to as a PLL circuit) composed of a phase comparator 1, a low-pass filter (hereinafter referred to as an LPF) 2, a voltage-controlled oscillator (hereinafter referred to as a VCO) 3, and a frequency divider 4. To the video switchover detection circuit, an external HD obtained by extracting and shaping a horizontal synchronization signal for a video signal and an external VD obtained by extracting and shaping a vertical synchronization signal are input. As input signals for detecting vide switchover, a horizontal synchronization signal and a vertical synchronization signal, or an external HD and external VD are used.

As an H system for detecting out of lock in the horizontal synchronization signal, the video switchover detection circuit comprises a reset signal generating circuit 5, a first counter 6 for counting the output pulse of the VCO 3, a decision value setting circuit 7, and a decision circuit 8. The decision value setting circuit 7 and the decision circuit 8 compose a horizontal synchronization decision section 9 equivalent to horizontal synchronization decision means for determining the lock state of a horizontal synchronization signal based on the count value of the first counter 6. As a V system for detecting out of lock in the vertical synchronization signal, the video switchover detection circuit comprises a reset signal generating circuit 10, a second counter 11 for counting the internal HD of the frequency divider 4, a decision value setting circuit 12, and a decision circuit 13. The decision value setting circuit 12 and the decision circuit 13 compose a vertical synchronization decision section 14 equivalent to vertical synchronization decision means for determining the lock state of a vertical synchronization signal based on the count value of the second counter 11. Further provided is an output circuit 15 equivalent to detection output means composed of an OR (logical conjunction) circuit for outputting as video switchover detection signals the outputs of the horizontal synchronization decision section 9 and the vertical synchronization decision section 14.

To one input terminal of the phase comparator equivalent to phase comparison means, the internal HD obtained by multiplying the output oscillating signal of the VCO 3 by 1/N by the frequency divider 4 is input as a reference signal. To the other input terminal, an external HD hat is based on the horizontal synchronization signal for a video signal is input. The phase comparator compares the phase of the internal HD with that of the external HD and outputs an error signal that goes active (for example HIGH level) when the phases differ with each other. The phase comparator 1 may be composed using a comparator or an EX-OR (exclusive OP) circuit. The frequency divider 4 is composed of for example a program counter.

The reset signal generating circuit 5 generates a reset signal based on the internal HD and the oscillating signal of the VCO 3 (hereinafter referred to as an output pulse) and outputs the reset signal to the reset terminal of the first counter 6. The first counter 6 equivalent to phase difference count means is adapted so that an error signal from the phase comparator 1 is input to the enable terminal, a reset signal from the reset signal generating circuit 5 is input to the reset terminal, and an output pulse from the VCO 3 is input to the clock terminal. In each horizontal period, when the error signal from the phase comparator 1 goes active, the output pulse of the VCO 3 is counted only for the active period.

In the horizontal synchronization decision section 9, the decision value setting circuit 7 sets in advance a decision value used to determine whether the horizontal synchronization signal is out of synchronization (PLL circuit is out of lock). The decision circuit 8 monitors the count value of the first counter 6 and, when the count value has exceeded the decision value, outputs an out-of-lock detection signal.

The reset signal generating circuit 10 generates a reset signal based on the internal HD and external VD and outputs the reset signal to the reset terminal of the second counter 11. The second counter 11 equivalent to horizontal synchronization count means is adapted so that the reset signal from a reset signal generating circuit is input to the reset terminal and an internal HD is input to the clock terminal, and the internal HD is counted after reset in each vertical period. In the vertical synchronization decision section 14, the decision value setting circuit 12 sets in advance a decision value used to determine whether the vertical synchronization signal is out of synchronization. The decision circuit 13 monitors the count value of the second counter 11 and, when the external VD is input at a count value smaller than the decision value, outputs an out-of-lock detection signal. The reset signal generating circuits 5 and 10 may be composed using a one-shot multi-circuit.

The output circuit 15 outputs as a video switchover detection signal the out-of-lock detection signal output from the horizontal synchronization decision section 9 or vertical synchronization decision section 14. The output circuit 15 may use an AND (logical conjunction) circuit instead or an OR circuit to simultaneously perform phase dislocation detection in the horizontal and vertical directions.

Operation of the video switchover detection circuit in the embodiment will be described. First, the out-of-lock detection operation in the H system will be described referring to FIG. 2. In FIG. 2, (A) shows the lock state of the horizontal synchronization signal while (B) shows the out-of-synchronization state (unlock state) of the horizontal synchronization signal.

The external HD that is based on the horizontal synchronization signal for the video signal is input to the phase comparator 1 and its phase is compared with that of the internal HD. In case the phases of the two input signals in the phase comparator 1 are not dislocated significantly from each other, the PLL circuit composed of the phase comparator 1, LPF 2, VCO 3 and frequency divider 4 is in the lock state and maintains a closed loop. In this case, from the phase comparator 1 an error signal ES with small time width is output with a short-interval timing as shown in FIG. 2(A). In FIG. 2, the output pulse of the VCO 3 is shown as a clock. In the reset signal generating circuit 5, a reset signal is generated with a predetermined clock timing at the trailing edge of the internal HD. This reset signal resets the first counter 6.

When the output of the phase comparator 1 is asserted and the error signal ES is output, the first counter 6 starts counting the output pulse of the VCO 3. While the error signal ES is active, the count value of the first counter 6 is incremented. In the horizontal synchronization decision section 9, the decision value of the decision value setting circuit 7 is set to approximately the maximum value (NH) in the range where the PLL circuit is locked. In this practice, the count value NX1 of the first counter is compared with the decision value NH with the timing at the leading edge of the external HD in the decision circuit 8. When NX1 is smaller than NH (NX1<NH), the phase difference between the external HD and the internal HD is small so that the PLL circuit is assumed as locked and the out-of-lock signal is not output. As a result, the video switchover detection signal is not output from the output circuit 15.

Figure 2B:
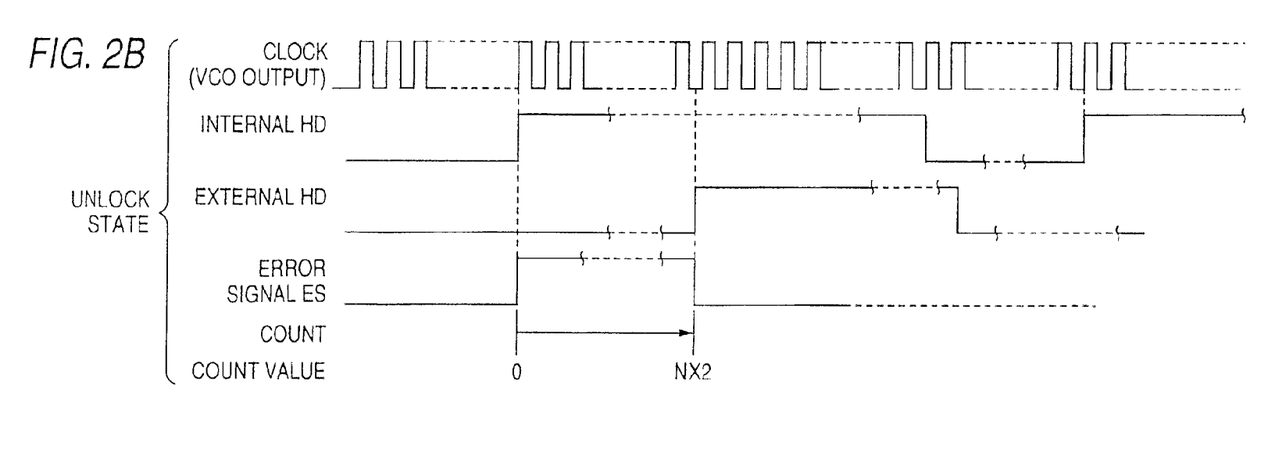
Figure 3A:
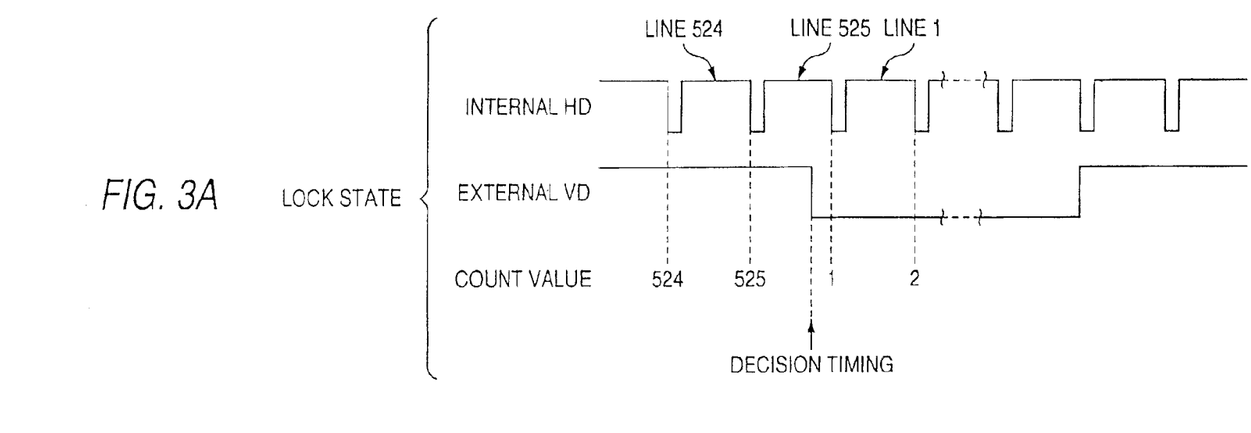
FIG. 3 is a timing chart showing the out-of-lock detection operation in the V system in the embodiment.

On the other hand, in case the horizontal synchronization signal becomes out of synchronization and the phase difference between the two input signals in the phase comparator 1 gets larger, from the phase comparator 1 an error signal ES with large time width is output with a long interval in which the phases differ from each other, as shown in FIG. 2(B). In this practice, same as the aforementioned case of the lock state, the first counter 6 starts counting the output pulse of VCO 3 and the count value NX is compared with the decision value NH with the timing at the leading edge of the external HD. The count value NX in this case is larger than the count value NH (NX1>NH), so that the phase difference between the external HD and the internal HD is large and the PLL circuit is assumed as out of lock and the out-of-lock signal is output. As a result, the video switchover detection signal is output from the output circuit 15 and out of lock in the horizontal synchronization signal is detected.

In this case, it suffices that the first counter 6 can count up to the count value (NH) large enough to detect out of lock. Thus a capacity of 3 or 4 bits of the first counter 6 is sufficient.

While the aforementioned example shows a case where the phase of the external HD is delayed behind the phase of the internal HD, an error signal is output likewise in case the phase of the external HD is advanced beyond the phase of the internal HD. Thus the operation is quite the same and corresponding description is omitted.

Next, the out-of-lock detection operation in the V system will be described referring to FIG. 3. In FIG. 3, (A) shows the lock state of the vertical synchronization signal while (B) shows the out-of-synchronization state (unlock state) of the vertical synchronization signal.

In the reset signal generating circuit 10, a reset signal is generated with the predetermined timing at the trailing edge of the internal HD that is based on the vertical synchronization signal for a video signal after the external VD has been deasserted, or with the timing at the leading edge of the external VD. This reset signal resets the second counter 11. The second counter 11 counts the internal HD (number of horizontal scanning lines in the video signal: Line n). In the vertical synchronization decision section 14, the counter value of the second counter 11 obtained when the external VD is deasserted is compared with the decision value of the decision value setting circuit 12. In this practice, the decision value NV of the decision value setting circuit is set to a count value (NV=525 assuming the NTSC system video signal) obtained in case the vertical synchronization signal is in the lock state.

When the vertical synchronization signal is in the lock state, the external VD is deasserted with a substantially normal timing against the internal HD, that is, between Line 525 and Line 1 of the next vertical period. In this case, the counter value matches the decision value in the second counter 11 so that synchronization with the vertical synchronization signal is assumed in the decision circuit 13. The out-of-lock signal is not output from the decision circuit 12 and the video switchover detection signal is not output from the output circuit 15.

Figure 3B:
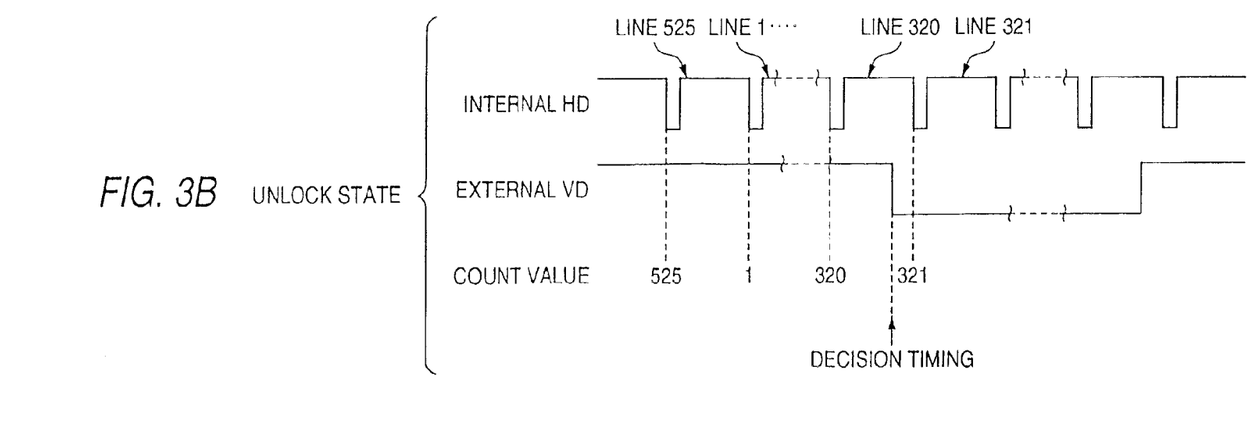

On the other hand, in case the external VD is deasserted earlier than the predetermined timing as in FIG. 3(B), the count value of the second counter 11 is smaller than the decision value and different from the decision value. This figure shows a case where the external VD is deasserted when the count value is 320. In this case, in the decision circuit 13, it is assumed that the vertical synchronization signal is placed out of synchronization (unlock state) in the middle of the scanning in the vertical direction. The out-of-lock signal is output from the decision circuit 13 and the video switchover detection signal is output from the output circuit 15. Then out of lock in the vertical synchronization signal is detected.

While the foregoing description assumes the point in time the counter value of the second counter 11 is 525 with the timing of the trailing edge of the external VD for simplicity, the lock state may be determined within a practical range including the case where the external VD is deasserted with a slight difference in time, in the vertical blanking period.

As mentioned earlier, in this embodiment, The counter in the H system counts the output pulse (clock) of the VCO in the period the error signal of the output of the phase comparator is active and out of lock is detected based on the magnitude of the phase difference between the internal HD (reference signal) and the external HD. This reduces the circuit scale of the counter and setting circuit as well as making it possible to detect out of synchronization of the horizontal synchronization signal by using a small-scale counter. In the V system, the counter counts the internal HD and out of lock is detected based on the count value at the trailing edge of the external VD, that is, the input timing of the external VD against the internal HD (reference signal). This allows detection of out of synchronization of the vertical synchronization signal by using a simple circuit comprising a small-scale counter. Through detection of out-of-lock state in at least one of the H system and the V system, it is possible to easily and securely switch over a video signal.

Decision of the count value to detect out of lock may be made with the timing the external HD is asserted in relation to the internal HD in the H system and with the timing the external VD is asserted in the V system. This reduces the time required for counting thus decreasing the detection time for video switchover.

According to the embodiment, it is possible to detect switchover of video signals with high accuracy and at a high speed through detection of the lock state of a horizontal or vertical synchronization signal, by using a small-scale simple circuit configuration, without the circuit configuration being complicated and upsized. Combination of out-of-lock detection in the H system and out-of-lock detection in the V system provides more secured and higher-accuracy detection of video signal switching.

Figure 4:
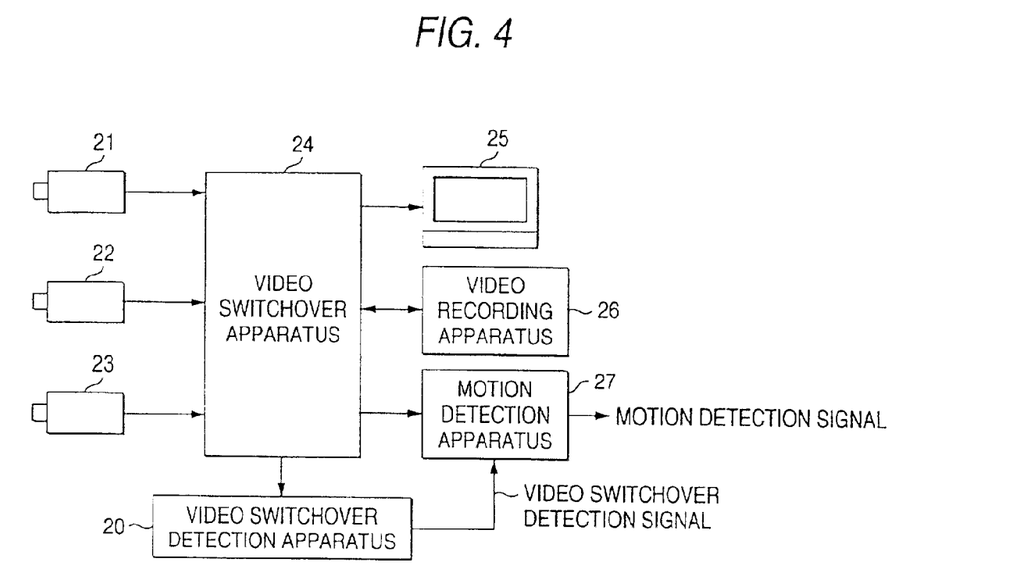
FIG. 4 is a block diagram showing the exemplary configuration of video monitoring apparatus as an application example of a video signal switchover detection circuit.

FIG. 4 is a block diagram showing the exemplary configuration of video monitoring apparatus as an application example of a video signal switchover detection circuit according to this embodiment. In the video monitoring apparatus, outputs of video cameras 21, 22, 23 installed in a plurality of locations are connected to video switchover apparatus 24. To the video switchover apparatus 24 a monitor 25 and video recording apparatus 26 are connected. The video switchover apparatus 24 is internally or externally equipped with video switchover detection apparatus 20 and motion detection apparatus 27.

Video signals shot and output by a plurality of video cameras 21, 22, 23 are switched over as required by the video switchover apparatus 24 and output to the monitor 25 and displayed as a picture or sent to the video recording apparatus 26 for recording. The motion detection apparatus 27 detects the motion in each video signal and outputs a motion detection signal. The video switchover detection apparatus 20 detects that the video signals from the video cameras are switched over.

In the video monitoring apparatus, any motion in the picture shot in each location is assumed as an abnormality such as presence of an invader. Thus, the motion detection apparatus 27 is used to, for example, issue an alarm from the video switchover apparatus 24 or a controller (not shown) depending on the output of the motion detection signal. However, the motion detection signal may be inadvertently output from the motion detection apparatus 27 when video signals are switched over. This can be prevented by halting the motion detection in the motion detection apparatus 27 for a predetermined period in case video signal switchover is detected, by using video switchover detection apparatus 20 comprising video switchover detection circuit according to the invention. In this case, it is possible to detect video signal switchover with high accuracy and at a high speed by way of a small-scale and simple circuit configuration, so that the configuration in this embodiment is considerable advantageous.

INDUSTRIAL APPLICABILITY

As mentioned earlier, according to the invention, it is possible to provide a video switchover detection circuit that reduces the circuit scale and allows high-accuracy detection with a smaller-scale configuration.

What is claimed is:

1. A video switchover detection circuit comprising a phase-locked loop circuit for comparing the phase of an input signal with that of an oscillating signal that is based on the input signal to perform phase synchronization, said video switchover detection circuit detecting switchover of input video signals by using a synchronization signal for a video signal used as said input signal and a reference signal that is based on said oscillating signal, said video switchover detection circuit comprising:

phase comparison means for comparing the phase of a horizontal synchronization signal for said video signal with that of said reference signal;

phase difference count means for starting to count time when a phase difference has occurred between both signals based on said phase comparison results and counting the period in which the phase difference persists;

horizontal synchronization decision means for determining out of synchronization of said video signal in the horizontal direction in case the count value has exceeded a predetermined decision value based on the count value of said phase difference count means; and detection output means for outputting a video switchover detection signal indicating switchover of video signals based on the output of said horizontal synchronization decision means.

2. A video switchover detection circuit according to claim 1, wherein said phase comparison means outputs an error signal that goes active and indicates phase dislocation when the phase of a horizontal synchronization signal for said video signal differs from that of said reference signal and that said phase difference count means counts the clock of said oscillating signal in the period in which the error signal is active thus counting the period in which phase difference persists when said error signal is input to the enable terminal.

3. A video switchover detection circuit according to claim 1, further comprising:

horizontal synchronization count means for counting the reference signal corresponding to the horizontal synchronization signal for said video signal; and vertical synchronization decision means for determining out of synchronization of said video signal in the vertical direction based on the count value of said horizontal synchronization count means in case the count value obtained when the vertical synchronization signal for said video signal is input is below a specified decision value, wherein said detection output means outputs a video switchover detection signal indicating switchover of video signals based on the output of said horizontal synchronization decision means and said vertical synchronization decision means.

4. A video switchover detection circuit comprising a phase-locked loop circuit for comparing the phase of an input signal with that of an oscillating signal that is based on the input signal to perform phase synchronization, said video switchover detection circuit detecting switchover of input video signals by using a synchronization signal for a video signal used as said input signal and a reference signal that is based on said oscillating signal, said video switchover detection circuit comprising:

horizontal synchronization count means for counting the horizontal synchronization signal for said video signal;

vertical synchronization decision means for determining out of synchronization of said video signal in the vertical direction based on the count value of said horizontal synchronization count means in case the count value obtained when the vertical synchronization signal for said video signal is input is below a specified decision value; and detection output means for outputting a video switchover detection signal indicating switchover of video signals based on the output of said vertical synchronization decision means.

* * * * *